United States Patent
Spica et al.

(10) Patent No.: US 7,437,531 B2
(45) Date of Patent: Oct. 14, 2008

(54) TESTING MEMORIES

(75) Inventors: Michael Spica, Hillsboro, OR (US);
Hehching Harry Li, Portland, OR (US);
Md Rezwanur Rahman, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 739 days.

(21) Appl. No.: 10/955,420

(22) Filed: Sep. 30, 2004

(65) Prior Publication Data
US 2006/0085710 A1    Apr. 20, 2006

(51) Int. Cl.
G06F 12/02 (2006.01)
G11C 29/18 (2006.01)
G01R 31/28 (2006.01)

(52) U.S. Cl. .................. 711/217; 714/718; 714/728
(58) Field of Classification Search .................. None
See application file for complete search history.

(56) References Cited

U.S. PATENT DOCUMENTS

| | | | |
|---|---|---|---|
| 4,433,413 A | 2/1984 | Fasang | |
| 4,974,184 A | 11/1990 | Avra | |
| 5,138,619 A | 8/1992 | Fasang et al. | |
| 5,383,143 A * | 1/1995 | Crouch et al. | 708/254 |
| 5,469,445 A * | 11/1995 | Nicolaidis | 714/726 |
| 5,574,733 A | 11/1996 | Kim | |
| 5,875,465 A | 2/1999 | Kilpatrick et al. | |
| 5,943,283 A | 8/1999 | Wong et al. | |
| 6,606,721 B1 | 8/2003 | Gowin, Jr. et al. | |
| 6,694,461 B1 | 2/2004 | Treuer | |
| 6,757,857 B2 | 6/2004 | Lamb et al. | |
| 6,769,081 B1 * | 7/2004 | Parulkar | 714/733 |
| 7,178,078 B2 * | 2/2007 | Hiraide et al. | 714/739 |

OTHER PUBLICATIONS

PI: Malgorzata Marek-Sadowska, "Sperical Pseudo-Random Pattern Testing". Final Report 1997-1998 for Micro Report 97-109. pp. 4 pgs.
A.J. van de Gorg; "Testing Semiconductor Memories". Chapter 5 "Psuedo-random RAM chip tests", pp. 171-213. 1991(c).

* cited by examiner

*Primary Examiner*—Denise Tran
(74) *Attorney, Agent, or Firm*—Blakely, Sokoloff, Taylor & Zafman LLP

(57) ABSTRACT

Methods and apparatus to test memories, such as, for example, caches of processors, are disclosed. In one aspect, an apparatus may include a pseudo random address generation unit, such as, for example, including a linear feedback shift register, to generate pseudo random memory addresses, and a deterministic data generation unit, such as, for example, including a state machine, to generate deterministic data to be written to the pseudo random memory addresses. Computer systems and other electronic systems including such apparatus are also disclosed.

8 Claims, 7 Drawing Sheets

Set 1: 000 → 001 → 010 → 011 → 100 → 101 → 110 → 111 → 000

Set 2: 000 → 010 → 110 → 011 → 101 → 001 → 111 → 100 → 000

Set 3: 000 → 100 → 111 → 001 → 101 → 011 → 110 → 010 → 000

Set 4: 000 → 110 → 100 → 010 → 101 → 111 → 011 → 001 → 000

Set 5: 000 → 001 → 011 → 111 → 101 → 010 → 100 → 110 → 000

Set 6: 000 → 011 → 110 → 001 → 100 → 111 → 010 → 101 → 000

Set 7: 000 → 101 → 010 → 111 → 100 → 001 → 110 → 011 → 000

Set 8: 000 → 111 → 110 → 101 → 100 → 011 → 010 → 001 → 000

TESTING MEMORIES

BACKGROUND

1. Field

Embodiments of the invention relate to memory testing.

2. Background Information

It may be beneficial to test memory arrays in order to detect faults, such as, for example, stuck-at faults, addressing faults, coupling faults, neighborhood pattern sensitive faults, indepotent faults, and the other faults. A variety of memory array testing protocols are known in the arts.

Certain protocols, such as, for example, deterministic marches, rely on an understanding of the physical topology of the memory array. However, such information about the memories may be confidential or otherwise unavailable, and this may adversely affect the deterministic tests.

Other protocols recognize that the topology may not be known and apply random address generation, random data, and random reads and writes. However, such tests may involve excessive test times and complicated test failure diagnostics. Additionally, such tests may have limited ability to test for addressing faults, since there may not be predictable reads and writes to the same address.

BRIEF DESCRIPTION OF THE SEVERAL VIEWS OF THE DRAWINGS

The invention may best be understood by referring to the following description and accompanying drawings that are used to illustrate embodiments of the invention. In the drawings:

FIG. 3 shows eight sets of deterministic data suitable for one or more embodiments of the invention.

FIG. 6 shows a shorthand or pseudocode representation of the method of FIG. 5, according to one or more embodiments of the invention.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Figure 1:
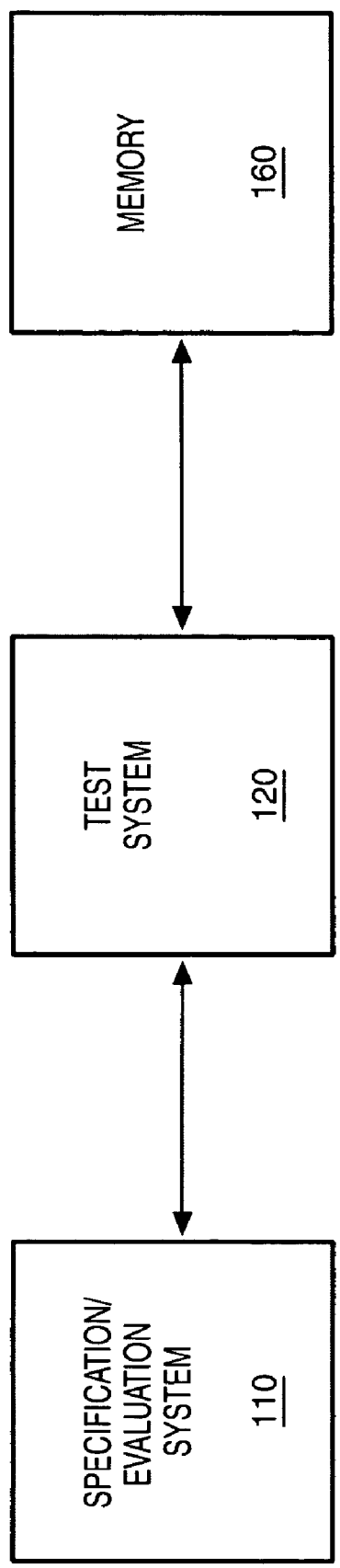
FIG. 1 shows a test specification and results evaluation system, a test system, and a memory, according to one or more embodiments of the invention.

FIG. 1 shows a test specification and results evaluation (specification/evaluation) system 110, a test system 120, and a memory 160, according to one or more embodiments of the invention. The specification/evaluation system may specify a test to be performed on the memory and may provide the test to the testing system. The testing system may receive the specified test, test the memory according to the specified test, receive results of the test, such as, for example, pass and/or fail information, and provide the results of the test to the specification/evaluation system. The specification/evaluation system may then evaluate the results of the test. If one or more faults are detected, the memory may be discarded, or repaired, for example.

Figure 2:
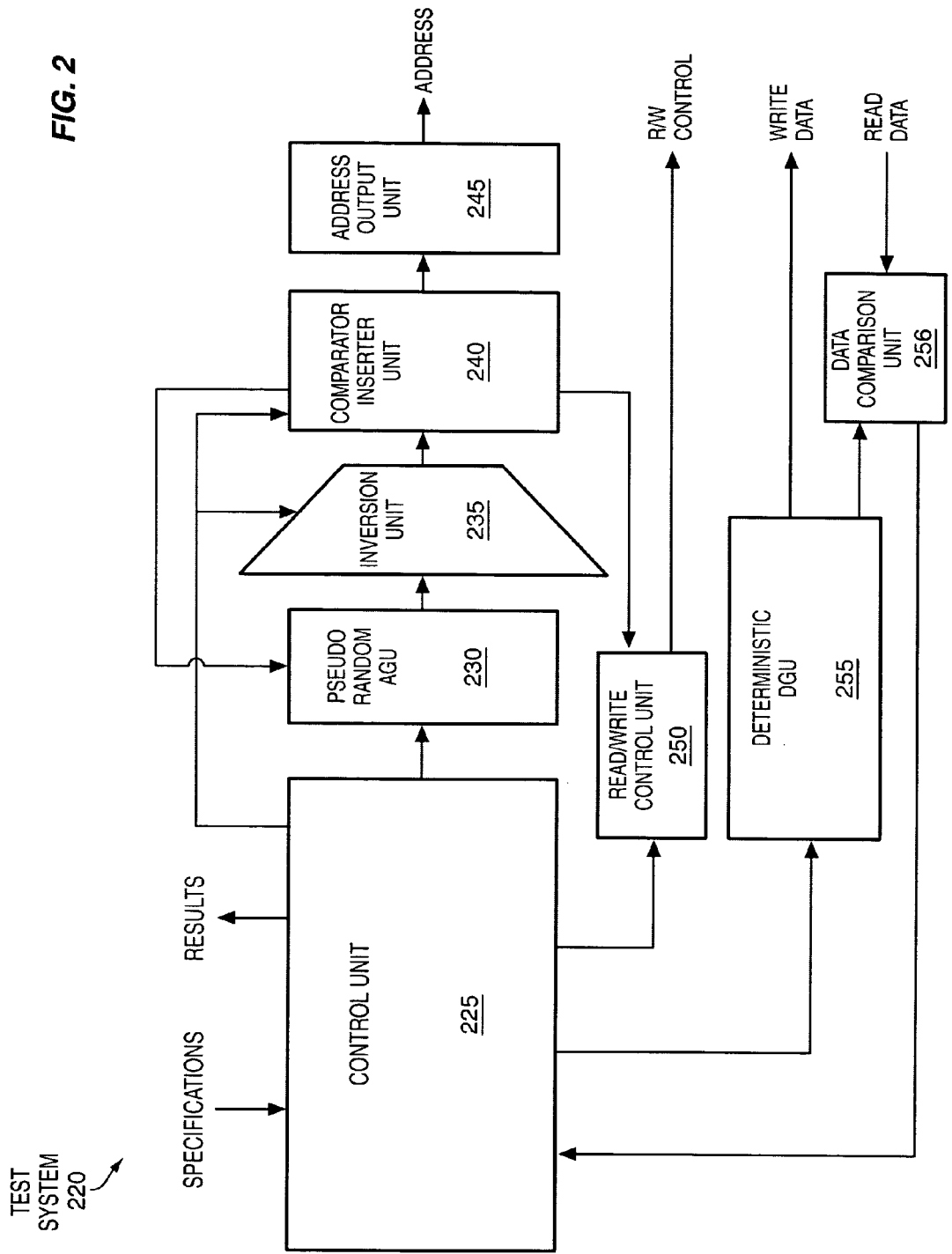
FIG. 2 shows a test system, according to one or more embodiments of the invention.

FIG. 2 shows a test system 220, according to one or more embodiments of the invention. The test system includes a control unit 225, a pseudo random address generation unit (AGU) 230, such as, for example, including one or more linear feedback shift registers, to generate pseudo random memory addresses, an inversion unit 235, a comparator range/address inserter (comparator/inserter) unit 240, an address output unit 245, a read/write control unit 250, a deterministic data generation unit (DGU) 255, such as, for example, including one or more state machines, to generate deterministic data to be written to the pseudo random memory addresses, and a data comparison unit 256.

The control unit may include one or more interfaces, such as, for example, one or more test access port (TAP) interfaces, to receive test specifications and provide test results. Potential test specification information may include, but is not limited to, information on how to generate pseudo random memory addresses (for example one or more polynomial selections and seed values), information on how to generate deterministic data (for example one or more data sequence selections and one or more start points), and information about the memory (for example the top range of the memory and/or other information about the logical topology of the memory).

The control unit may include control registers that may be programmed or otherwise provided with test specification information. For example, one or more polynomials, seed values, data sequence selections, and starting points in the sequences may be stored in the control registers. One or more of the control registers may be used to provide a loop counter to loop or otherwise count through a memory address space so that data may be written to and/or read from the different addresses. In one aspect, the counter may match or otherwise correspond in size to the memory address space. For example, an eleven-bit counter may be included to count through the addresses of an eleven-bit indexed memory.

The control unit may be coupled with other components of the test system, such as, for example, in the illustrated embodiment, with the pseudo random AGU, the inversion unit, the comparator/inserter unit, the read/write control unit, the deterministic DGU, and the data comparison unit. The control unit may provide information and control to the components. For example, the control unit may provide test specifications to the components. The control unit may also provide a global clock to control the timing, transitions, and/or states of other components.

The pseudo random AGU is coupled with the control unit and may receive information, controls, and/or clocking from the control unit. The pseudo random AGU may generate pseudo random memory addresses and sequences thereof. As used herein, a pseudo random address means an address that may appear to be random, but may in fact be predictable.

In one or more embodiments of the invention, the pseudo random AGU may include one or more linear feedback shift registers (LFSRs), such as, for example one or more programmable LFSRs. The one or more LFSRs may evaluate or otherwise use one or more polynomials, such as, for example, prime polynomials, and one or more seed values in order to generate the pseudo random memory addresses and sequences thereof. The polynomials may include mathematical functions, which may be implemented in hardware, software, or some combination, which are capable of providing individually unique transitions through the memory address space, which appear to be random, but which are predictable. Various suitable polynomials are known in the LFSR arts. In one aspect, the control unit may program the one or more programmable LFSRs with the polynomials and seed values based on test specification information and/or information hard programmed in the control unit. Non-programmable LFSRs may also optionally be included and used, although they may tend to limit the flexibility and customizability of the tests.

In one aspect, the size or repeat loop of the LFSR may match or otherwise correspond with the size of the memory address space. For example, in one or more embodiments of the invention, in order to address all N-addresses of a memory address space, an N-length polynomial may be used for an LFSR. However, a property of an N-length polynomial includes that it may provide only N−1 unique pseudo random numbers/addresses, not N unique pseudo random numbers/addresses. One address of the memory address space, such as an all zero address, may remain un-addressed.

Referring again to FIG. 2, the illustrated test system includes the comparator/inserter unit. The comparator/inserter unit is coupled with an output of the pseudo random AGU and may receive a pseudo random memory address. In one or more embodiments of the invention, the comparator/inserter unit may insert an additional memory address so that all addresses of the memory address space may be visited by the test system. In one aspect, an address including either all zeros or all ones may be inserted. For example, an address including all zeros may be inserted if the output of a polynomial is used for addressing and/or an address including all ones may be inserted if the inverse of the output of a polynomial is used for addressing. In one aspect, the additional address may be inserted immediately after an address matches a seed value. The address inserter portion of the comparator/inserter unit is optional and not required. In one or more embodiments, it is not required that all addresses of the memory be tested, and analysis of the results may optionally be adapted to accommodate for the non-addressed memory addresses.

As shown in the illustrated embodiment, a single unit may be used to perform both comparison of range and to insert a cycle, such as, for example, in order to reuse common comparison and other functionality, although this is not required. In one or more alternate embodiments of the invention, separate comparator and inserter units may optionally be included and used.

Now, the use of LFSRs for pseudo random address generation is not required. In one or more alternate embodiments, a predetermined sequence of pseudo random numbers, such as, for example, which may be generated by a computer system running a random number generator, may be hard programmed in a memory, such as, for example, a RAM. The sequence may be read or otherwise provided from the memory as pseudo random addresses or sequences thereof. Other pseudo random AGUs capable of generating pseudo random memory addresses and/or sequences that may be used to write and/or read data to and/or from the memory may also optionally be included and used.

Let's discuss one further point associated with addressing before moving on to discuss data generation. Some memories have ranges that are not fully $2^n$ (for example 1, 2, 4, 8, 16, 32, etc.) in length. When testing such memories, the pseudo random AGU may generate memory addresses that are not in range. For example, the AGU may generate an address of 32, when the memory has a shorter length of, for example, 30.

With reference again to FIG. 2, the illustrated test system includes the comparator/inserter unit. The comparator/inserter unit is coupled with the pseudo random AGU via the inversion unit, and may receive a pseudo random memory address. In one or more embodiments of the invention, the comparator/inserter unit may compare the pseudo random memory address with a top range of memory addresses for the particular memory tested, which may be provided to the comparator/inserter unit by the control unit along with other potential test specification information.

If the comparison indicates that the pseudo random memory address is less than the top range or within range, the comparator/inserter unit may provide the pseudo random memory address as output to the address output unit. Address generation may be slower than data generation and may in some embodiments be provided with a head start. The address output unit may include a pipeline or other buffer to delay output of an address, such as, for example, to synchronize address and data output, and then output the memory address to the memory. In one or more embodiments of the invention, the comparator/inserter unit may provide a signal to the read/write control unit to allow reads and/or writes to the memory. As shown, the comparator/inserter unit may be coupled with the read/write control unit to provide such signals. Alternatively, in one or more other embodiments, reads and/or writes from the read/write control unit to the memory may optionally be enabled or allowed in the absence of a signal indicating otherwise from the comparator/inserter unit.

Conversely, if the comparison indicates that the pseudo random memory address is greater than the top range or out of range, the comparator/inserter unit may provide a signal to the read/write control unit to stop output of the address and/or stop reads and/or writes to the memory until a pseudo random memory address is in range. When the pseudo random memory address is determined to be out of range, the comparator/inserter unit may also optionally provide a signal to the pseudo random AGU requesting a new address. As shown, the comparator/inserter unit may be coupled with the pseudo random AGU to provide such signals.

Now, the comparator range portion of the comparator/inserter unit is optional and not required. In one or more embodiments of the invention, rather than using the comparator range portion, the AGU may be adapted to suppress memory addresses greater than the top range. Nor is it required that the apparatus be capable of testing memories with less than $2^n$ memory addresses.

In one or more embodiments of the invention, rather than using an evaluation of a polynomial of the LFSR to generate a pseudo random memory address, an inverse of the output or evaluation of a polynomial may be used to generate a pseudo random memory address. The test system optionally includes the inversion unit coupled with the pseudo random AGU to invert a pseudo random memory address. Using an inverse of a memory address may offer certain potential advantages, such as stressing the memory, as will be discussed further below. However, inclusion of the inversion unit is optional, and not required.

Now, let's discuss generation of the deterministic data. Referring again to FIG. 2, the testing system further includes the deterministic DGU. The deterministic DGU is coupled with the control unit and may receive information, controls, and/or clocking from the control unit. The deterministic DGU may generate deterministic and/or predetermined data that may be written to, and optionally subsequently read from, the memory. As used herein, deterministic data means data that may be predicted or otherwise determined from one or more preceding events. The deterministic data may be predetermined by the one or more preceding events.

In one or more embodiments of the invention, the deterministic DGU may include one or more state machines. The state machines may generate deterministic and/or predetermined data according to a set of allowed states, a start state, and allowed transitions that map current states to next states. Given a current state and the allowed transitions, for which there may be exactly one transition from each current state to a next state, the next state may be determined.

FIG. 3 shows eight sets of deterministic data suitable for one or more embodiments of the invention. Each set includes eight unique three-bit data values, which covers all possible transitions for a three-bit sequence. Arrows are used to show allowed transitions between the data values. In the left-hand column of each set, from top-to-bottom, the data values are referred to herein as D0, D1, D2, D3, D4, D5, D6, or D7. For example, in the first set, D0 has a value of 000, D1 has a value of 001, and so on. In one or more embodiments of the invention, D7 may be determined or predetermined based on D6, D6 may be predetermined based on D5, D5 may be predetermined based on D4, and so on. For example, within the same row, the three-bit data value listed in the right-hand column may represent an allowed state transition from the three-bit data value listed in the left-hand column. By way of example, for the first set, 001 (D1) may follow an allowed state transition from 000 (D0), and 010 (D2) may follow an allowed state transition from 001 (D1), and so on. For clarity, the scope of the invention is not limited to these sets or any set thereof.

In the case of a word oriented memory, the three-bit data values may be written to the cells at the same time. If the data word width is greater than three-bits, then the three-bits may be mapped in order from least significant bit to most significant bit into the corresponding bit positions. For example, an eight-bit word may include three at least partial images of the base three-bit sequence, such as, for example, 11011011, where the right-most two-bits include the lower order bits and the highest order bit, for example 0, has been removed. If the word width is smaller than three-bits, then the lower order subset of bits may be used. By way of example, exemplary sequences of repeating three-bit data values that may be written into an eight-bit word include 00000000, 001001000, 01001001, 01101101, 10010010, 10110110, 11011011, and 11111111.

Figure 4:
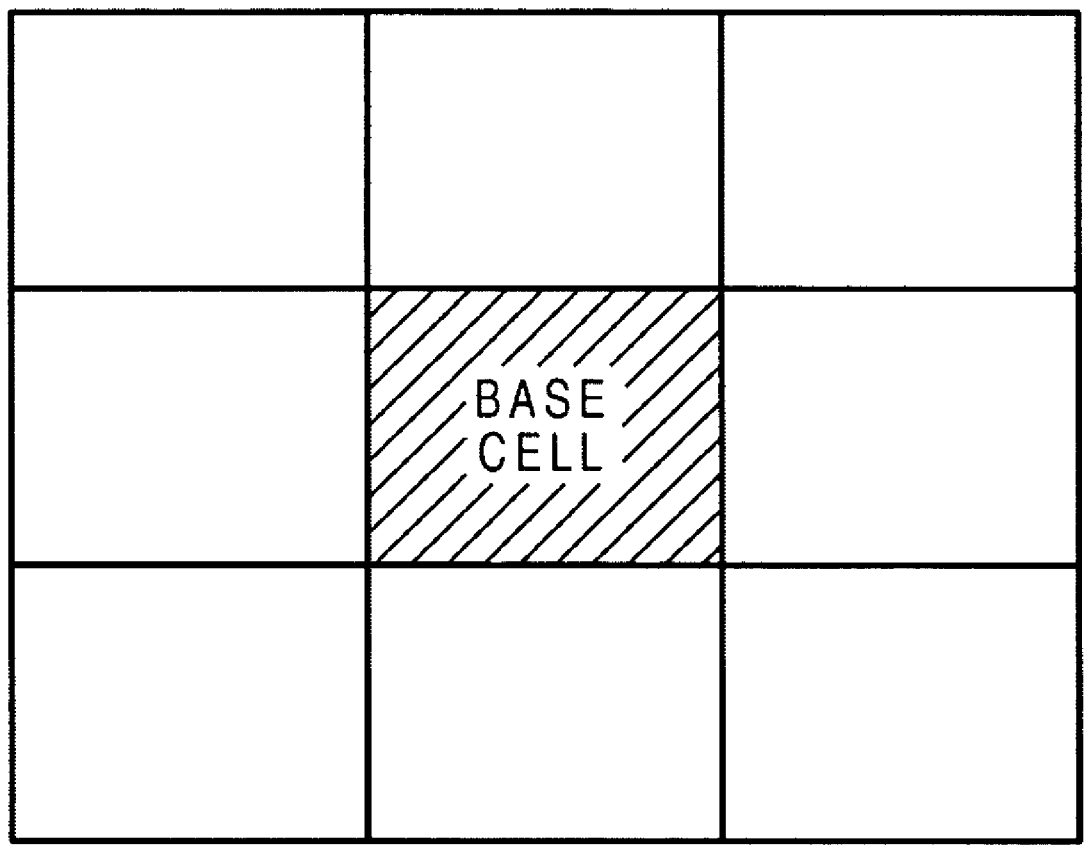
FIG. 4 shows an exemplary unit layout of a memory, according to one or more embodiments of the invention.

Now, the use of three-bit data values may offer certain potential advantages. To illustrate, consider FIG. 4, shows an exemplary unit layout of a memory, such as, for example, a RAM memory, according to one or more embodiments of the invention. The layout includes nine cells including a base cell, at center, and eight adjoining cells, which surround the base cell. Certain cell faults tend to be stimulated by reads and/or writes in which there is a dependency on the neighboring cell state. In one aspect, in order to help test the base cell for pattern sensitive faults, a large number of states, or all possible states, may optionally be provided around the base cell.

In one or more embodiments, in order to help test with a large number of surround conditions, nine cells, which may each store a bit, may be broken up into three rows. In one or more embodiments of the invention, a three-bit data value, such as, for example, one from FIG. 3, may be written to the three cells above the base cell, and another three-bit data value may be written to the three cells below the base cell, while the data in the three cells in the middle is unchanged. This process may be repeated with different data values, cycling through 2×2×2 times in order to give the eight base data values. Going through this eight times, such as, for example, by using all eight sets of data values, may completely capture all surround conditions and may go through each of the transition conditions for each unique data topology. This may provide a high probability that indempotent coupling faults may be detected. However, the scope of the invention is not limited in this respect, or to any known standard or quality of testing. Subsets of such data values and/or inferior tests may be sufficient for other implementations of embodiments of the invention.

The deterministic data generation unit, which as stated may include a state machine, may generate the predetermined and/or deterministic data based on a selected set, such as, for example, set 1, and a starting value, such as, for example, 011. By way of example, for set 1 and a starting value of 011, the deterministic DGU may generate 100, then 101, then 110, and so on. However, the use of a state machine is not required. In one or more other embodiments of the invention, rather than using a state machine, the DGU may include a sequence of data programmed or hard programmed in a memory.

Referring again to FIG. 2, the deterministic data may be provided as write data from the DGU to the memory. The read/write control unit is coupled with the control unit and may provide read and write control signals to the memory. In one or more embodiments of the invention, the read/write control unit may be implemented as a state machine to switch between controlling the read and write operations. When the deterministic data generated by the deterministic DGU is to be written to the memory, the read/write control unit may provide a write control signal to the memory.

The deterministic data may also be provided as comparison deterministic data to the data comparison unit, which may optionally include a register or other memory to store the deterministic data. As shown, the data comparison unit may be coupled with the deterministic DGU to receive the data. Alternatively, when data is to be read from the memory to the data comparison unit, the read/write control unit may provide a read control signal to the memory. The data may then be read to the data comparison unit. The data comparison unit may be capable of on-the-fly comparison of the read data with the data previously received from the deterministic DGU, which may simplify evaluation of the test results. The data comparison unit is coupled with the control unit and may provide results of the comparison, such as, for example, indicating whether the comparison indicates that the data is the same or different, to the control unit, as test result information. The data comparison unit is optional and not required. In one or more other embodiments, the data comparison unit may optionally be omitted and the read data may be provided to the control unit and output through the interface thereof prior to comparison and evaluation of the test results.

Figure 5:
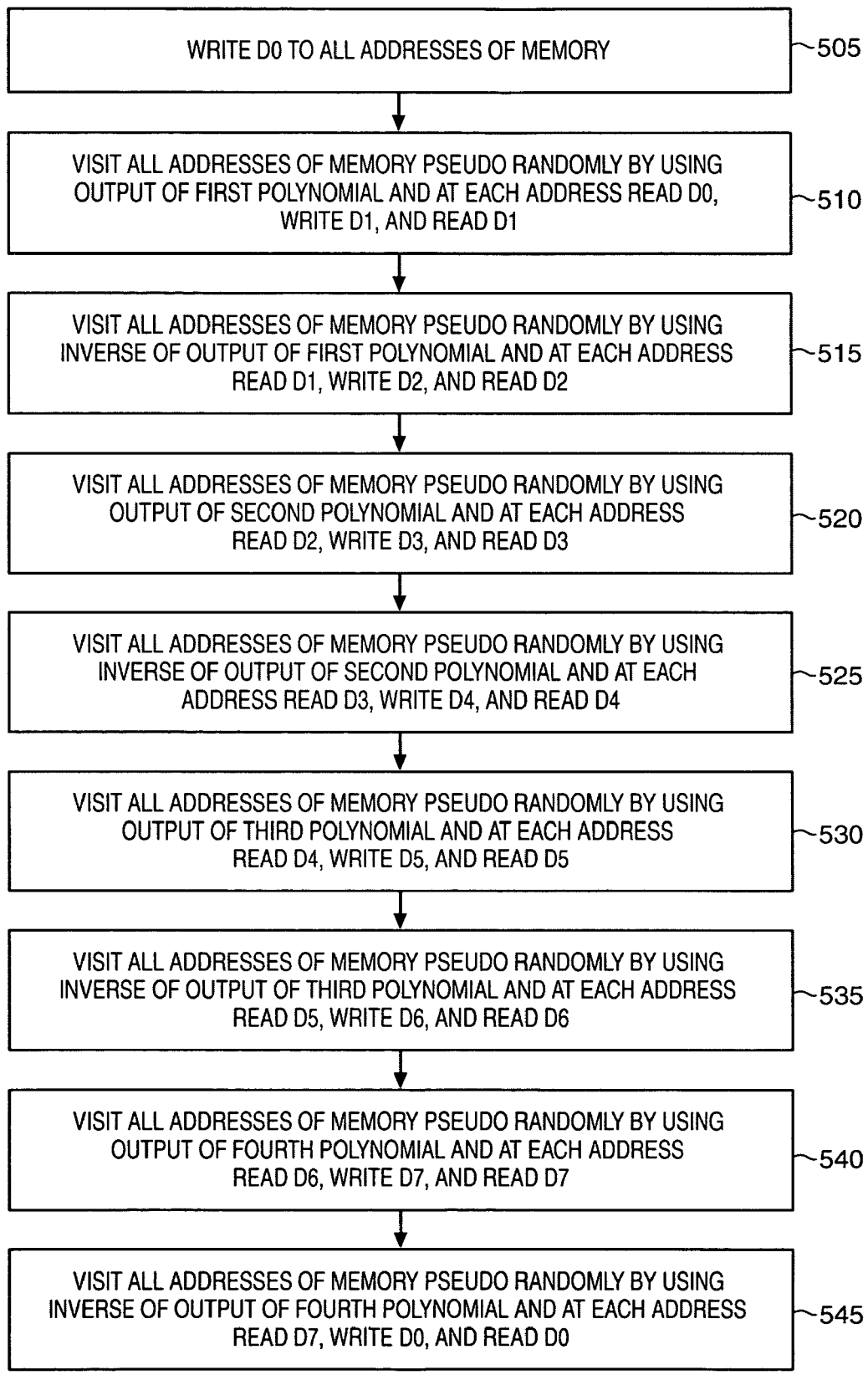
FIG. 5 shows a flow diagram of a method of testing a memory, according to one or more embodiments of the invention.

Many different methods of testing a memory are suitable. FIG. 5 shows a flow diagram of a method of testing a memory, according to one or more embodiments of the invention.

The method includes writing a first predetermined data, such as, for example, D0, to all addresses of the memory, at block 505. In one aspect, the addresses may be visited linearly, such as, for example, starting from the base of the memory and continuing through to the end, although this is not required.

Then, at block 510, all addresses of the memory are visited using pseudo random memory addresses generated by evaluating a first polynomial. At each visit of a memory address, a back-to-back sequence of operations is performed before moving on to another memory address. In the sequence of operations, the first predetermined value, for example D0, is read from the present memory address. The first predetermined value presumably corresponds to the previously written first predetermined value, assuming that there are no memory faults. Then, the sequence of operations includes writing a second predetermined data, such as, for example D1 to the present memory address. Next, the sequence of operations includes reading back the second predetermined data, for example D1, from the present memory address. Again, the written and subsequently read second predetermined data presumably should match, assuming that there are no memory faults. The polynomial may be evaluated to generate other pseudo random memory addresses, and the back-to-back sequence of operations may be performed for each memory address. If an address if visited more than once, the initial read may find improper data, such as, for example, D1 instead of D0, which may help to detect simple addressing faults.

The initial read may help to test whether the data written to the memory has been properly preserved, and may, for example, help to test for stuck-at faults. A read resulting in a discrepancy with predetermined data that was previously written may indicate a memory fault and may be noted in the test results. In one or more embodiments, the read, write, and read may be performed at speed in order to help detect certain faults, such as, for example, write-after-read recovery faults and read-after-write recovery faults. The back-to-back read, write, read sequence at each address may also offer a potential advantage of improved detection of addressing faults. However, the scope of the invention is not limited in this respect. In one or more alternate embodiments, the last read of the sequence may optionally be omitted.

Next, at block 515, all addresses of the memory are visited again using pseudo random memory addresses generated by inverting an evaluation of the first polynomial, and at each visit of a memory address a back-to-back sequence is performed in which the second predetermined data, for example D1, is read, a third predetermined data, such as, for example, D2, is written, and the third predetermined data, for example D2, is read. As previously discussed, the inversion unit may be coupled with the pseudo random AGU to receive an address, and may invert the address.

The inverse of the output of the first polynomial may give the complementary address space as the first polynomial. Using the outputs of a polynomial and the inverse of the output of the polynomial, which directly follow one another, either in the mentioned order, or in the reverse order, may offer certain potential advantages, but is not required. One potential advantage is that this may provide a complementary address that reverses the stress that was provided by the non-inverted polynomial. Another potential advantage is that it may provide a cheap substitute for a polynomial and may help to reduce the number of prime polynomials that are used. However, inverting the evaluation of the first polynomial is not required. In one or more other embodiments, a different polynomial may be evaluated to generate the pseudo random addresses.

Then, at block 520, all addresses of the memory are visited using pseudo random memory addresses generated by evaluating a second polynomial, and at each visit of a memory address a back-to-back sequence is performed in which the third predetermined data, for example D2, is read, a fourth predetermined data, such as, for example, D3, is written, and the fourth predetermined value, for example D3, is read.

Next, at block 525, all addresses of the memory are visited again using pseudo random memory addresses generated by inverting an evaluation of the second polynomial, and at each visit of a memory address a back-to-back sequence is performed in which the fourth predetermined data, for example D3, is read, a fifth predetermined data, such as, for example, D4, is written, and the fifth predetermined data, for example D4, is read.

Then, at block 530, all addresses of the memory are visited using pseudo random memory addresses generated by evaluating a third polynomial, and at each visit of a memory address a back-to-back sequence is performed in which the fifth predetermined data, for example D4, is read, a sixth predetermined data, such as, for example, D5, is written, and the sixth predetermined data, for example D5, is read.

Next, at block 535, all addresses of the memory are visited again using pseudo random memory addresses generated inverting an evaluation of the third polynomial, and at each visit of a memory address a back-to-back sequence is performed in which the sixth predetermined data, for example D5, is read, a seventh predetermined data, such as, for example, D6, is written, and the seventh predetermined data, for example D6, is read.

Then, at block 540, all addresses of the memory are visited using pseudo random memory addresses generated by evaluating a fourth polynomial, and at each visit of a memory address a back-to-back sequence is performed in which the seventh predetermined data, for example D6, is read, an eighth predetermined data, such as, for example, D7, is written, and the eighth predetermined data, for example D7, is read.

Next, at block 545, all addresses of the memory are visited again using pseudo random memory addresses generated by inverting an evaluation of the fourth polynomial, and at each visit of a memory address a back-to-back sequence is performed in which the eighth predetermined data, for example D7, is read, the first predetermined data, such as, for example, D0, is written, and the first predetermined data, for example D0, is read.

Various prime polynomials for LFSRs are known in the arts. By way of example, here are four suitable prime polynomials for an 11-bit LFSR, which are suitable for implementing the above-described method:

$$X^{11}+X^{10}+X^9+X^7+1$$

$$X^{11}+X^{10}+X^9+X^5+1$$

$$X^{11}+X^{10}+X^9+X^2+1$$

$$X^{11}+X^{10}+X^8+X^6+1$$

These are just a few examples of four-tap polynomials. A variety of suitable 2, 6, and 8 tap prime polynomials, for example, are also known in the arts.

To implement method shown in FIG. 5, the pseudo random AGU may include a plurality of polynomial registers to hold the referenced polynomials. For example, the AGU may include four registers. As another option, less than four polynomial registers may be used, such as, for example, if one or more polynomials may be shifted in while one or more other polynomials are being used, for example with the use of a shadow register.

Now, many modifications and adaptations to the above-described method are contemplated. In one aspect, one or more operations may optionally be removed from the method. For example, it is not required that a read-write-read sequence be used, although this may offer potential advantages, such as, for example, improved detection of addressing faults. As another example, there is no requirement that four different polynomials be used. Either more or less may optionally be used. Still further, it is not required that an inverse of a polynomial be used, or that the polynomial and inverse directly follow one another, although as discussed this may offer potential advantages. In another aspect, one or more operations may optionally be performed in a different sequence. For example, the data may be introduced backwards, such as, for example, from D7 through D0. As another example, an inverse of a polynomial may come before its polynomial. These are just a few of the contemplated modifications.

Flexibility is one potential advantage of the test method disclosed above. Different polynomials and combinations and orderings of polynomials may optionally be used to provide variability to the test. One or more different data sets and combinations and/or orderings of the data sets may also optionally be used to provide variability to the test. Seed values provide yet another avenue for varying the test coverage. Additionally, a single set of data, such as, for example, set 1, may be executed, or else different sets of data, such as, for example, two, three, four, or more sets, may be executed. The sets may be executed independently, such as, as segmented blocks. This may offer certain potential advantages, such as, for example, allowing the capability to use either a short test, such as, for example, for test time reduction, or a longer test, for more extensive memory testing. This may also facilitate analysis of the results, which are segmented by data set.

FIG. 6 shows a shorthand or pseudocode representation of the method of FIG. 5, according to one or more embodiments of the invention. "W" denotes writing data to the memory, and "R" denotes reading data from the memory. "^" denotes cycling through or visiting a full traversal of the memory address space. "^1" denotes cycling through or visiting a full traversal of the memory address space by using the first polynomial to generate the pseudo random sequence of memory addresses. "^1*" denotes cycling through or visiting a full traversal of the memory address space by using the inverted value of the first polynomial to generate the pseudo random memory addresses. "^2" denotes cycling through or visiting a full traversal of the memory address space by using the first polynomial to generate the pseudo random sequence of memory addresses by using the second polynomial to generate the pseudo random memory addresses, and so on for a total of four polynomials, in this particular protocol. The scope of the invention is not limited to this particular protocol.

Figure 7:
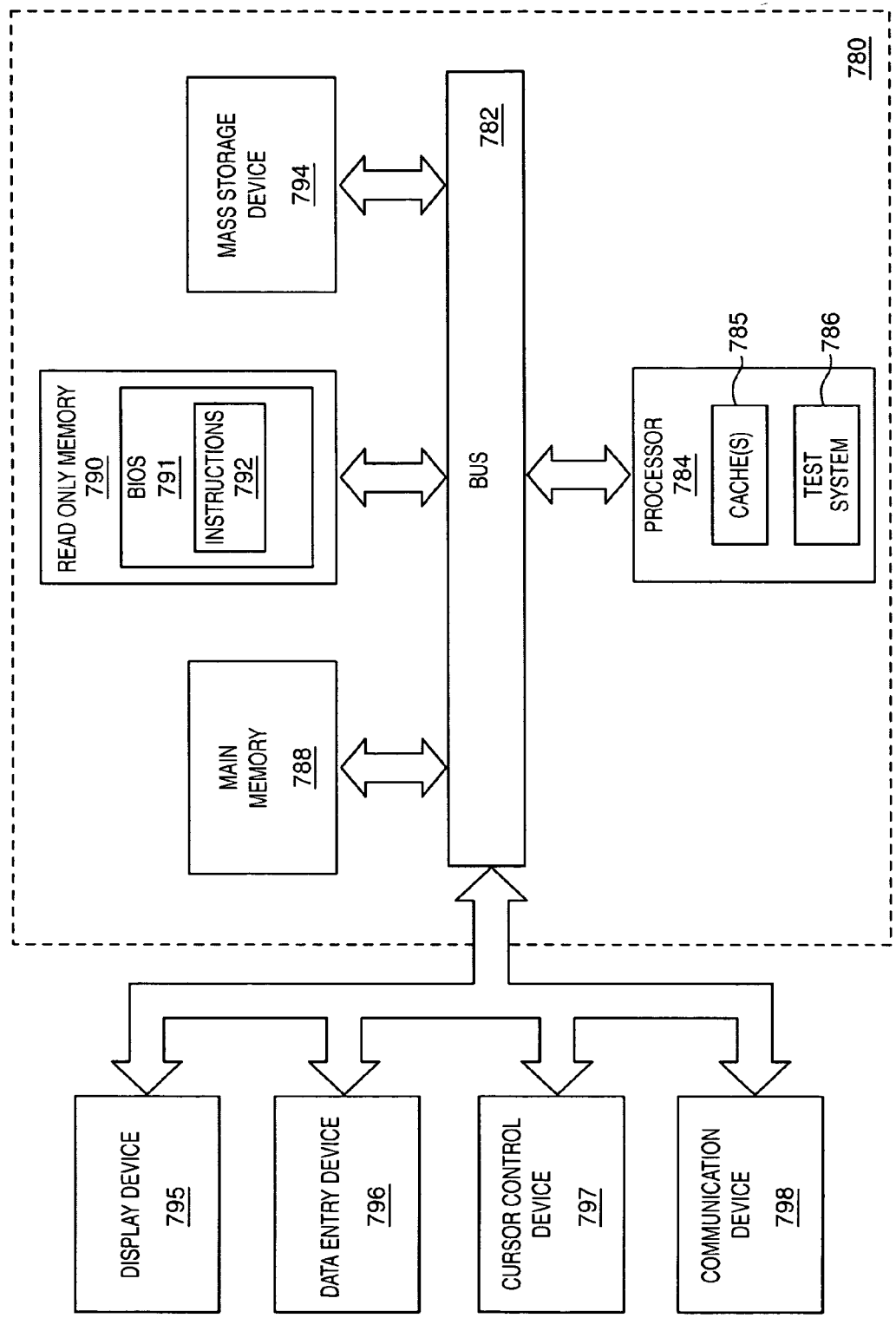
FIG. 7 shows a block diagram of a computer system in which one or more embodiments of the invention may be implemented.

FIG. 7 shows a block diagram of a computer system 780 in which one or more embodiments of the invention may be implemented. As used herein, a "system" or "computer system" may include an apparatus having hardware and/or software to process data. The computer system may include, but is not limited to, a portable, laptop, desktop, server, or mainframe computer, to name just a few examples. The computer system represents one possible computer system for implementing one or more embodiments of the invention, however other computer systems and variations of the computer system are also possible.

The computer system includes a bus 782 to communicate information, and a processor 784 coupled with the bus to process information. In one or more embodiments of the invention, the processor may include a microprocessor available from Intel Corporation, of Santa Clara, Calif. The processor includes a memory, such as, for example, one or more caches 785. In one or more embodiments of the invention, the processor may include a built-in test system 786, such as, for example, to test one or more caches.

The computer system includes a main memory 788, such as, for example, a random access memory (RAM) or other dynamic storage device, coupled with the bus to store information including instructions to be executed by the processor. Different types of RAM memory that are included in some, but not all computer systems, include, but are not limited to, static-RAM (SRAM) and dynamic-RAM (DRAM).

The computer system includes a read only memory (ROM) 790 coupled with the bus to store static information and instructions for the processor, such as, for example, a basic input-output system (BIOS) 791. Different types of memory that are included in some, but not all, computer systems include Flash memory, programmable ROM (PROM), erasable-and-programmable ROM (EPROM), and electrically-erasable-and-programmable ROM (EEPROM). A mass storage device 794 such as, for example, a magnetic disk, zip, or optical disc, and its corresponding drive, may also optionally be coupled with the bus to store information and instructions.

In one or more embodiments of the invention, the BIOS may include instructions 792 to at least partially specify a test to be performed on the memory or one or more caches of the processor by the test system 786. In one or more embodiments of the invention, the instructions of the BIOS may specify the test at start-up of the computer system, and the test system may perform the test at start-up.

The computer system may also optionally be coupled via the bus with a display device 795, such as, for example, a cathode ray tube (CRT) or liquid crystal display (LCD), to display information to an end user. A data entry device 796, such as, for example, a keyboard or other alphanumeric input device including alphanumeric and other keys, may optionally be coupled with the bus to communicate information and command selections to the processor. Another type of user input device that may optionally be included is a cursor control device 797, such as, for example, a mouse, trackball, or cursor direction keys, to communicate direction information and command selections to the processor, and to control cursor movement on the display device.

A communication device 798 may also optionally be coupled with the bus. Communication devices are included in some, but not all, computer systems. Depending upon the particular implementation, the communication device may include a modem, a network interface card, or other well-known interface devices, such as, for example, those used for coupling with Ethernet, token ring, or other types of physical attachment for purposes of providing a communication link to support a local or wide area network, for example.

Embodiments of the invention are not limited to any particular computer system. Rather, one or more embodiments may be used on any stand alone, distributed, networked, or other type of computer system. For example, one or more embodiments may be used on one or more computers compatible with NT, Linux, Windows, Macintosh, any variation of Unix, or others.

In the description above, for the purposes of explanation, numerous specific details have been set forth in order to provide a thorough understanding of the embodiments of the invention. It will be apparent, however, that one or more other embodiments may be practiced without some of these specific details. In other instances, well-known circuits, structures, devices, and techniques have been shown in block diagram form or without detail in order not to obscure the understanding of this description.

One or more embodiments of the invention may include various operations. The operations may be performed by hardware components, or may be embodied in machine-executable instructions, which may be used to cause or otherwise result in a general-purpose or special-purpose processor or logic circuits programmed with the instructions performing the operations. Alternatively, the operations may be performed by a combination of hardware and software.

One or more embodiments of the invention may be provided as a program product or other article of manufacture that may include a machine-accessible or readable medium having stored thereon one or more instructions and/or data structures. For example, instructions that result in a processor performing one or more of pseudo random address generation, deterministic data generation, range comparison of pseudo random memory addresses, memory address insertion, or data comparison, may optionally be included in a test system. The machine-accessible medium may provide the instructions, which, if executed by a machine, may cause or otherwise result in the machine to perform one or more operations or methods as disclosed herein. Suitable machines include, but are not limited to, computer systems, network devices, personal digital assistants (PDAs), and a wide variety of other devices with one or more processors, to name just a few examples. The machine-accessible medium may include, a mechanism that provides, for example stores and/or transmits, information in a form that is accessible by a machine. For example, a machine-accessible medium may include recordable and/or non-recordable media, such as a floppy diskette, optical storage media, optical disk, CD-ROM, magnetic disk storage media, magneto-optical disk, read only memory (ROM), random access memory (RAM), EPROM, EEPROM, Flash memory, or combination, to name just a few examples. A machine-accessible medium may also include an electrical, optical, acoustical or other form of propagated signal, such as carrier waves, infrared signals, digital signals, for example. One or more embodiments of the invention may be downloaded as a computer program product, wherein the program may be transferred from one computer or other machine to another computer or other machine by way of data signals embodied in a carrier wave or other propagation signal or medium via a communication link, such as, for example, a modem or network connection.

Many of the methods are described in their most basic form, but operations may be added to or deleted from the methods. It will be apparent to those skilled in the art that many further modifications and adaptations may be made. The particular embodiments are not provided to limit the invention but to illustrate it. The scope of the invention is not to be determined by the specific examples provided above but only by the claims below.

In the claims, any element that does not explicitly state "means for" performing a specified function, or "step for" performing a specified function, is not to be interpreted as a "means" or "step" clause as specified in 35 U.S.C. Section 112, Paragraph 6. In particular, the use of "step of" in the claims herein is not intended to invoke the provisions of 35 U.S.C. Section 112, Paragraph 6.

It should also be appreciated that reference throughout this specification to "one embodiment", "an embodiment", or "one or more embodiments", for example, means that a particular feature may be included in the practice of the invention. Similarly, it should be appreciated that in the foregoing description of exemplary embodiments of the invention, various features are sometimes grouped together in a single embodiment, Figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

While the invention has been described in terms of several embodiments, those skilled in the art will recognize that the invention is not limited to the embodiments described, but may be practiced with modification and alteration within the spirit and scope of the appended claims. The description is thus to be regarded as illustrative instead of limiting.

What is claimed is:

1. A method comprising:
   pseudo randomly generating a first plurality of memory addresses of a memory based on evaluation of a first polynomial;
   at each of the first plurality of memory addresses, initially reading data, then writing data, and then reading data;
   pseudo randomly generating a second plurality of memory addresses of the memory based on inverting an evaluation of the first polynomial;
   at each of the second plurality of memory addresses, initially reading data, then writing data, and then reading data;
   pseudo randomly generating a third plurality of memory addresses of the memory based on evaluation of a second polynomial, wherein the second polynomial is different than the first polynomial;
   at each of the third plurality of memory addresses, initially reading data, then writing data, and then reading data; and
   performing additional pseudo random writes of data to the memory such that all possible surround conditions for each base cell of the memory are captured.

2. The method of claim 1, further comprising transitioning through all possible transitions for each cell surrounding each base cell.

3. The method of claim 1, further comprising comparing a pseudo random memory address with a top range of a memory.

4. The method of claim 1, further comprising receiving a pseudo random memory address and in response inserting an all zero memory address.

5. An apparatus comprising:
   a control unit;
   a pseudo random address generation unit coupled with the control unit, the pseudo random address generation unit to generate a first plurality of pseudo random memory addresses based on evaluation of a first polynomial, a second plurality of pseudo random memory addresses based on evaluation of the first polynomial, and a third plurality of pseudo random memory addresses based on evaluation of a second polynomial wherein the second polynomial is different than the first polynomial;
   an inversion unit coupled with the pseudo random address generation unit and coupled with the control unit, the inversion unit to invert the second plurality of pseudo random memory addresses based on control from the control unit; and
   a deterministic data generation unit coupled with the control unit, the deterministic data generation unit to generate deterministic data, wherein the deterministic data generation unit is to generate a plurality of different sets of deterministic data sufficient to capture all possible surround conditions for each base cell of a memory.

6. The apparatus of claim 5, wherein the deterministic data generation unit is to generate different sets of deterministic data sufficient to transition through all possible transitions for each cell surrounding each base cell.

7. The apparatus of claim 5, further comprising a comparator range unit coupled with the pseudo random address generation unit to receive a pseudo random memory address and to compare the received pseudo random memory address with a top range of a memory.

8. The apparatus of claim 5, further comprising an address inserter unit coupled with the pseudo random address generation unit to receive a pseudo random memory address and to subsequently insert an all zero memory address.

* * * * *